(12) United States Patent
Fukubayashi

(10) Patent No.: US 10,157,242 B2
(45) Date of Patent: Dec. 18, 2018

(54) CHARGER ARRANGEMENT PLANNING SUPPORTING APPARATUS, CHARGER ARRANGEMENT PLANNING SUPPORTING METHOD, AND PROGRAM

(75) Inventor: Yuichiro Fukubayashi, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 485 days.

(21) Appl. No.: 13/983,604

(22) PCT Filed: Jan. 31, 2012

(86) PCT No.: PCT/JP2012/052124
§ 371 (c)(1),
(2), (4) Date: Aug. 5, 2013

(87) PCT Pub. No.: WO2012/105544
PCT Pub. Date: Aug. 9, 2012

(65) Prior Publication Data
US 2013/0317790 A1    Nov. 28, 2013

(30) Foreign Application Priority Data
Feb. 3, 2011  (JP) .................................. 2011-021887

(51) Int. Cl.
*G06G 7/48* (2006.01)
*G06F 17/50* (2006.01)
(Continued)

(52) U.S. Cl.
CPC .............. *G06F 17/50* (2013.01); *B60L 3/12* (2013.01); *B60L 11/1816* (2013.01);
(Continued)

(58) Field of Classification Search
CPC .. G06F 17/50; B60L 11/1816; B60L 11/1861; B60L 3/12; B60L 2260/52;
(Continued)

(56) References Cited

U.S. PATENT DOCUMENTS

| 6,941,197 B1 * | 9/2005 | Murakami | .......... B60L 11/1816 |
| | | | 320/109 |
| 2009/0114463 A1 * | 5/2009 | DeVault | ................. B60K 6/365 |
| | | | 180/65.29 |

(Continued)

FOREIGN PATENT DOCUMENTS

| JP | 9-248738 A | 9/1997 |
| JP | 2004-287771 A | 10/2004 |

(Continued)

OTHER PUBLICATIONS

Wang, Ying-Wei, "Simulation of Service Capacity an Electric Scooter Refueling System", 2008, Transportation Research Part D, 13, Elsevier, Ltd.*

(Continued)

*Primary Examiner* — Cedric Johnson
(74) *Attorney, Agent, or Firm* — Sughrue Mion, PLLC

(57) ABSTRACT

A charger arrangement planning supporting apparatus includes a simulation unit configured to simulate, on a virtual road network, movement of a plurality of virtual electric vehicles and consumption of rechargeable batteries and simulate situations of use of the plurality of virtual chargers arranged on the virtual road network and a charger determining unit configured to select which of the virtual chargers is used to charge the virtual electric vehicle when the virtual electric vehicle needs to be charged on the basis of residual charge of the rechargeable battery and a present location of the virtual electric vehicle and a situation of use and a location of each of the chargers,. The simulation unit outputs, after finishing the simulation, a movement history of the virtual electric vehicle and an operation history of the virtual charger.

14 Claims, 11 Drawing Sheets

(51) Int. Cl.
*B60L 3/12* (2006.01)
*B60L 11/18* (2006.01)

(52) U.S. Cl.
CPC ....... *B60L 11/1861* (2013.01); *B60L 2240/68* (2013.01); *B60L 2240/72* (2013.01); *B60L 2240/80* (2013.01); *B60L 2250/16* (2013.01); *B60L 2260/52* (2013.01); *B60L 2260/54* (2013.01); *Y02T 10/705* (2013.01); *Y02T 10/7005* (2013.01); *Y02T 10/7044* (2013.01); *Y02T 10/7072* (2013.01); *Y02T 10/7291* (2013.01); *Y02T 90/14* (2013.01); *Y02T 90/16* (2013.01); *Y02T 90/161* (2013.01); *Y02T 90/163* (2013.01)

(58) Field of Classification Search
CPC ............. B60L 2250/16; B60L 2240/80; B60L 2240/72; B60L 2260/54; Y02T 10/7291; Y02T 90/16; Y02T 90/14; Y02T 90/163; Y02T 90/161; Y02T 10/7072; Y02T 10/7044; Y02T 10/7005; Y02T 10/705
USPC ................................................... 703/1, 8, 6
See application file for complete search history.

(56) References Cited

U.S. PATENT DOCUMENTS

| | | | |
|---|---|---|---|
| 2010/0138098 A1 | 6/2010 | Takahara et al. | |
| 2012/0005125 A1* | 1/2012 | Jammer | B60L 11/1848 705/412 |

FOREIGN PATENT DOCUMENTS

| | | | | |
|---|---|---|---|---|
| JP | 2006-331405 A | | 12/2006 | |
| JP | 2008-97509 A | | 4/2008 | |
| JP | 2010-239849 A | | 10/2010 | |
| JP | 2010-286449 A | | 12/2010 | |
| JP | 2011-13893 A | | 1/2011 | |
| JP | 2011013893 A | * | 1/2011 | |
| JP | 2011-238182 A | | 11/2011 | |

OTHER PUBLICATIONS

Wang, Hengsong et al., "A Novel Approach for the Layout of Electric Vehicle Charging Station", 2010, IEEE.*
Fluhr, Jonas et al., "A Stochastic Model for Simulating the Availability of Electric Vehicles for Services to the Power Grid", 2010, Proceedings of the 43rd Hawaii International Conference on System Sciences, IEEE Computer Society.*
International Search Report for PCT/JP2012/052124 dated Mar. 27, 2012.
Ryoji Hiwatari et al., "Development of Traffic Simulator for Analysis on Charging Infrastructure of Next Generation Vehicle—Basic Analysis System toward Spread of Electric Vehicle", Central Research Institute of Electric Power Industry, Jun. 2010, (22 pages total), http://criepi.denken.or.jp/jp/kenkikaku/report/detail/L09009.html.
English Translation of communication dated Jan. 20, 2015, issued by the Korean Intellectual Property Office in counterpart Application No. 519980958731.
Minwoo Jeong et al., "The project competition for undergraduate students—Location strategy and modeling of charging stations for electric automobiles," Korean Institute of Industrial Engineers Conference Fall 2010 (Nov. 2010).
Hengsong Wang et al "A Novel Approach for the Layout of Electric Vehicle Charging Station" Apperceiving Computing and Intelligence Analysis 2010,2010.
Jeonghoon Yoo et al., "An optimal model for positioning natural gas stations considering spatial accessibility and traffic cost," Journal of Korean Society of Transportation. vol. 26, No. 3 (Jun. 2008).
Communication dated Dec. 6, 2016, issued by the European Patent Office in corresponding European Application No. 12742131.1.

* cited by examiner

Fig. 3

| ORIGIN\DESTINATION | 1 | ... | j | ... | n | TOTAL |
|---|---|---|---|---|---|---|
| 1 | $t_{1,1}$ | ... | $t_{1,j}$ | ... | $t_{1,n}$ | $O_1$ |
| ... | ... | ... | ... | ... | ... | ... |
| i | $t_{i,1}$ | ... | $t_{i,j}$ | ... | $t_{i,n}$ | $O_i$ |
| ... | ... | ... | ... | ... | ... | ... |
| n | $t_{n,1}$ | ... | $t_{n,j}$ | ... | $t_{n,n}$ | $O_n$ |
| TOTAL | $D_1$ | ... | $D_j$ | ... | $D_n$ | $T$ |

Fig. 6

| CHARGER | EXCESS MOVING DISTANCE (km) | REACHABLE TIME (MIN) |
|---|---|---|
| CHARGER A | 0 | 15 |
| CHARGER B | 7 | 12 |
| CHARGER C | 10 | 5 |
| ⋮ | ⋮ | |

Fig. 8

| CHARGER | LOCATION | RATE OF OPERATION (%) | ACCUMULATED WAITING TIME (MIN) | NUMBER OF TIMES OF USE |
|---|---|---|---|---|
| QC001 | 35.571503,139.660314 | 30.5 | 12 | 14 |
| QC002 | 35.649537,139.748057 | 40.1 | 31 | 19 |
| QC003 | 34.734352,135.73485 | 17.9 | 7 | 8 |
| ... | ... | ... | ... | ... |
| AVERAGE VALUE | - | 35.6 | 17.9 | 10.2 |

Fig. 9

| VEHICLE | ORIGIN | DESTINATION | MOVING DISTANCE(km) | CHARGER IN USE | NUMBER OF TIMES OF USE | ELECTRICITY SHORTAGE LOCATION | NUMBER OF TIMES OF ELECTRICITY SHORTAGE |
|---|---|---|---|---|---|---|---|
| car001 | 1 | 5 | 120 | QC001, QC003 | 2 | - | 0 |
| car002 | 4 | 2 | 70 | QC004 | 1 | - | 0 |
| car003 | 3 | 3 | 50 | - | 0 | - | 0 |
| car004 | 2 | 7 | 150 | QC001 | 1 | 34.735018,135.734925 | 1 |
| ... | ... | ... | ... | ... | ... | ... | ... |
| AVERAGE VALUE | - | - | 80 | - | 1.3 | - | 0.2 |

CHARGER ARRANGEMENT PLANNING SUPPORTING APPARATUS, CHARGER ARRANGEMENT PLANNING SUPPORTING METHOD, AND PROGRAM

CROSS REFERENCE TO RELATED APPLICATIONS

This application is a National Stage of International Application No. PCT/JP2012/052124 filed Jan. 31, 2012, claiming priority based on Japanese Patent Application No. 2011-021887 filed Feb. 3, 2011, the contents of all of which are incorporated herein by reference in their entirety.

BACKGROUND

The present invention relates to a charger arrangement planning supporting apparatus, a charger arrangement planning supporting method, and a program.

Today's electric automobiles are capable of cruising only relatively a shorter distance than gasoline powered automobiles. Because of this shorter cruising distance, the users of the former have greater concern than those of the latter over running out of power during driving before reaching destinations. Therefore, it is indispensable to put in place more charging facilities, in particular, quick chargers in order to facilitate the convenience of electric automobile users.

With a charger conventionally utilized for the electric automobile today, it takes about 20 to 30 minutes to charge the battery. This length of time for charging is longer than that for filling gas at gas stations. Therefore, in cases where a nearest charger or a charger on a travelling route is occupied, a driver will have to find unoccupied charger elsewhere by making a detour or have to find another time to do charging. If a driver can learn through a portable terminal or a car navigation system the present or near-future situations of use of chargers set in various places, he/she can find an alternative charger more easily, taking into account a driving route and remaining battery power.

For example, Patent Document 1 discloses a secondary battery supply system including a secondary battery managing apparatus configured to manage charging of a secondary battery, an information providing apparatus configured to provide a user of an electric automobile with charging facility information, and a general management apparatus configured to manage both the apparatuses. The secondary battery supply system can provide the user with the charging facility information reflecting conveniences and demands on the charging facilities that supply secondary batteries.

Patent Document 1: Patent Publication JP-A-2006-331405

A charger business operator needs to set charging facilities appropriately by taking into account minimizing costs of setting facilities and other expenses while maximizing profits. For this purpose, the charger business operator needs to plan the setting of charging facilities on the supposition that users can efficiently use the facilities on the basis of information on actual traffic conditions and usage states of the charging facilities.

However, conventionally, a technique for supporting the planning of the setting of the charging facilities on such an assumption has not been proposed.

SUMMARY

Therefore, an exemplary object of the present invention is to support the planning of setting of charging facilities on the supposition that users efficiently use the charging facilities on the basis of information on traffic conditions and states of use of the charging facilities.

A charger arrangement planning supporting apparatus according to the present invention includes: a simulation unit configured to simulate, on a virtual road network, movement of a plurality of virtual electric vehicles and consumption of rechargeable batteries and simulate situations of use of the plurality of virtual chargers arranged on the virtual road network; and a charger determining unit configured to select which of the virtual chargers is used to charge the virtual electric vehicle when the virtual electric vehicle needs to be charged on the basis of residual charge of the rechargeable battery and a present location of the virtual electric vehicle and a situation of use and a location of each of the chargers. The simulation unit outputs, after finishing the simulation, a movement history of the virtual electric vehicle and an operation history of the virtual charger.

According to an exemplary aspect of the present invention it is possible to support the planning of the setting of the charging facilities on the assumption that users efficiently use the charging facilities on the basis of states of road traffic and states of use of the charging facilities.

DESCRIPTION OF THE DRAWINGS

FIG. 3 is a diagram showing an example of a movement model of a vehicle stored by the traffic model storing unit.

FIG. 6 is a diagram for explaining a method in which a charger determining unit determines virtual chargers according to the first embodiment of the present invention.

FIG. 8 is a diagram showing an example of operation histories of the virtual chargers output by a simulation unit as simulation results according to the first embodiment of the present invention.

FIG. 9 is a diagram showing an example of movement histories of virtual vehicles output by the simulation unit as simulation results according to the first embodiment of the present invention.

EXEMPLARY EMBODIMENT

Next, an exemplary embodiment of the present invention will be described in detail with reference to the drawings.

First Embodiment.

Figure 1:
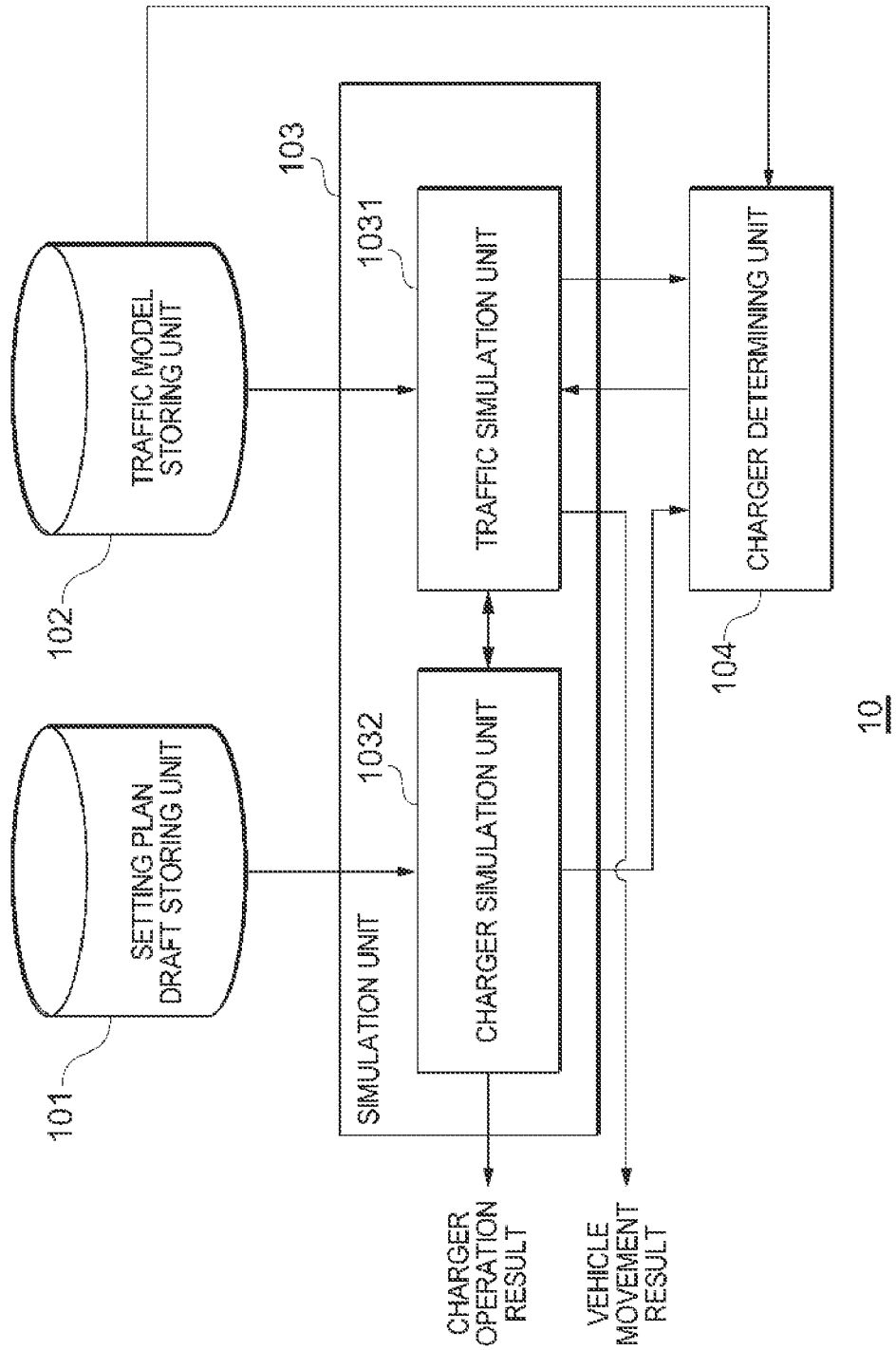
FIG. 1 is a block diagram showing the configuration of a charger arrangement planning supporting apparatus according to a first embodiment of the present invention.

FIG. 1 is a block diagram showing the configuration of a charger arrangement planning supporting apparatus 10 according to a first embodiment of the present invention. As shown in the figure, the charger arrangement planning supporting apparatus 10 includes a setting plan draft storing unit 101, a traffic model storing unit 102, a simulation unit 103, and a charger determining unit 104. The simulation unit 103 includes a traffic simulation unit 1031 and a charger simulation unit 1032.

As the charger arrangement planning supporting apparatus 10, a dedicated or general-purpose computer including a CPU, memories such as a ROM and a RAM, an external storage device configured to store various kinds of information, an input interface, an output interface, a communication interface, and a bus for connecting the foregoing can be applied. The charger arrangement planning supporting apparatus 10 may be configured by a single computer or may be configured by a plurality of computers connected to one another via a communication line.

The simulation unit 103 and the charger determining unit 104 are equivalent to modules of functions realized by the CPU executing a predetermined program stored in the ROM or the like. The setting plan draft storing unit 101 and the traffic model storing unit 102 are implemented by the external storage device.

The setting plan draft storing unit 101 retains, for example, candidates of places where chargers are set in the real world and the number of chargers. The chargers cannot be set anywhere. It is assumed that the chargers are set in existing gas stations, shopping centers, parking lots, and the like. Therefore, places where the chargers are supposed to be able to be set and the number of chargers that can be set are stored in the setting plan draft storing unit 101 in advance. The places where the chargers are set are retained in a form in which positions can be specified on road data retained by the traffic model storing unit 102 such as coordinates, latitudes and longitudes, or the like on a map. Information concerning the candidates of the setting places of the chargers and the number of chargers is transmitted to the simulation unit 103 and used to determine places where virtual chargers are set and the number of virtual chargers in the simulation unit 103.

The traffic model storing unit 102 stores information concerning a road network in the real world and a movement model of vehicles in the road network. Alternatively, the traffic model storing unit 102 may store information concerning imaginary roads and roads obtained by changing roads in the real world.

Figure 2:
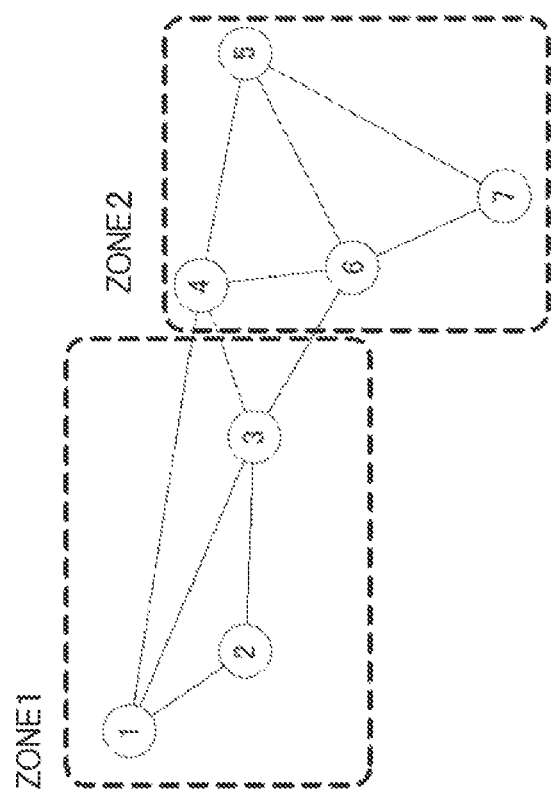
FIG. 2 is a diagram showing an example of information of a road network stored by a traffic model storing unit.

The information concerning the road network stored by the traffic model storing unit 102 is represented by, for example, as shown in FIG. 2, nodes corresponding to intersections and links corresponding to roads that connect the intersections. In the links, distances, the numbers of lanes, speed limits, and the like are set as parameters representing characteristics of the roads. These parameters affect moving times of vehicles and degrees of congestion of the roads.

The movement model of the vehicles stored by the traffic model storing unit 102 is represented by an OD (Origin-Destination) table, for example, as shown in FIG. 3. The OD table indicates the number of vehicles moving from an origin zone to a destination zone. In FIG. 3, the number of vehicles moving from a zone i to a zone j is $t_{ij}$. Therefore, a total number of vehicles starting from the zone i is $O_i = \Sigma_j t_{ij}$ and a total number of vehicles arriving at the zone j is $D_j = \Sigma_i t_{ij}$. In FIG. 3, the zone includes several nodes as shown in FIG. 2.

The simulation unit 103 includes a traffic simulation unit 1031 configured to simulate the movement of a plurality of virtual electric vehicles and consumption of rechargeable batteries on a virtual road network obtained by reproducing roads in the real world and a charger simulation unit 1032 configured to simulate situations of use of virtual batteries.

The traffic simulation unit 1031 simulates traffic on virtual roads using the road network and the movement model of the vehicles acquired from the traffic model storing unit 102. Specifically, the traffic simulation unit 1031 arranges $O_i$ virtual vehicles in the origin zones i on the basis of the OD table shown in FIG. 3. The traffic simulation unit 1031 appropriately determines origin nodes, starting times, and the like of the virtual vehicles on the basis of population distributions in the origin zones, traffic survey data, and the like. For example, if data indicating that the number of vehicles starting the zone i at 8:00 to 9:00 is 20% of all vehicles stating from the zone i is obtained, the number of virtual vehicles starting from the zone i to the zone j at 8:00 to 9:00 is set to 0.2 $t_{ij}$.

After completing the arrangement of the virtual vehicles, the traffic simulation unit 1031 starts movement of the virtual vehicles to destination zones. In the movement, the virtual vehicles move while consuming the rechargeable batteries. Therefore, when residual charges of the rechargeable batteries run short during the movement, the traffic simulation unit 1031 determines, with the charger determining unit 104, in which of the chargers the virtual vehicles are charged and moves the virtual vehicles to setting places of the chargers. Therefore, during the simulation, the traffic simulation unit 1031 transmits parameters concerning the virtual vehicles such as locations of the virtual vehicles, residual charges of the rechargeable batteries, and the destination zones to the charger determining unit 104.

The charger simulation unit 1032 simulates situations of use of the virtual chargers arranged on the virtual road network and transmits the situations to the charger determining unit 104. When the virtual vehicle with little residual charge of the rechargeable battery comes to each of the virtual chargers and starts charging, the virtual charger changes to "in use". The other virtual vehicles cannot use the virtual charger until the charging is completed. Therefore, while a certain virtual charger is "in use", a virtual vehicle coming to the virtual charger after the preceding virtual charger waits its turn of charging on the spot. When the charging is completed, the state of the virtual charger returns to "usable". The charger simulation unit 1032 notifies the charger determining unit 104 of a change in the state of the virtual charger ("in use" and "usable"). Time required until completion of charging of one virtual vehicle, charging speed, and the like are appropriately set to match characteristics of each of the virtual chargers.

The charger determining unit 104 acquires data of the road network from the traffic model storing unit 102, acquires parameters concerning the virtual vehicles such as the locations of the virtual vehicles, the residual charges of the rechargeable batteries, and destinations (destination zones) from the traffic simulation unit 1031, and acquires parameters such as the locations and the situations of use of the virtual chargers from the charger simulation unit 1032. When charging of the virtual vehicles is necessary, the charger determining unit 104 determines which virtual chargers are used to charge the virtual vehicles. A result of the determination is transmitted to the traffic simulation unit

1031. The virtual vehicles move to the setting place of each of the virtual chargers according to the determination and perform charging.

The charger determining unit 104 determines, according to the situations of use of the virtual chargers and the states of the virtual vehicles, the virtual chargers to be selected. For example, when the virtual charger on a route to the destination zone is "in use" and cannot be used, the charger determining unit 104 searches for usable another virtual charger without substantially changing the route and selects the virtual charger. Even if the residual charge of the rechargeable battery of a certain virtual vehicle is still sufficient, when there is an unoccupied virtual charger on the route, the charger determining unit 104 may determine that the virtual vehicle is charged by the virtual charger. When the virtual charger on the route is "in use" and cannot be used, the charger determining unit 104 may select a closest virtual charger a little way back a road that the virtual vehicle passed. In this way, the charger determining unit 104 selects the virtual charger to reduce waiting times for charging of the virtual vehicles and moving times to the destination zone as much as possible.

When all the virtual vehicles arrive at the destination and the simulation ends, the simulation unit 103 outputs movement histories of the virtual vehicles and operation histories of the virtual chargers as simulation results. The simulation results can be used as reference information for planning charger setting in the real world.

For example, the traffic simulation unit 1031 outputs, as the movement histories of the virtual vehicles, routes, traveling distances, charging places, the numbers of times of electricity shortage, locations where the electricity shortage occurs, and the like. For example, if the locations where the virtual vehicles caused electricity shortage are displayed on a map using this data, the locations can be used for examining in which places chargers should be set or added in the real world.

The charger simulation unit 1032 outputs, as the operation histories of the virtual chargers, histories of situations of use of the virtual chargers during the simulation, waiting times until charging of the virtual vehicles, and the like. For example, if average rates of operation of the virtual chargers are calculated using this data, it is possible to examine removal of the virtual chargers with low rates of operation from a setting plan and examine addition of chargers near the virtual chargers with high rates of operation.

The operation of the charger arrangement planning supporting apparatus 10 is explained.

Figure 4:
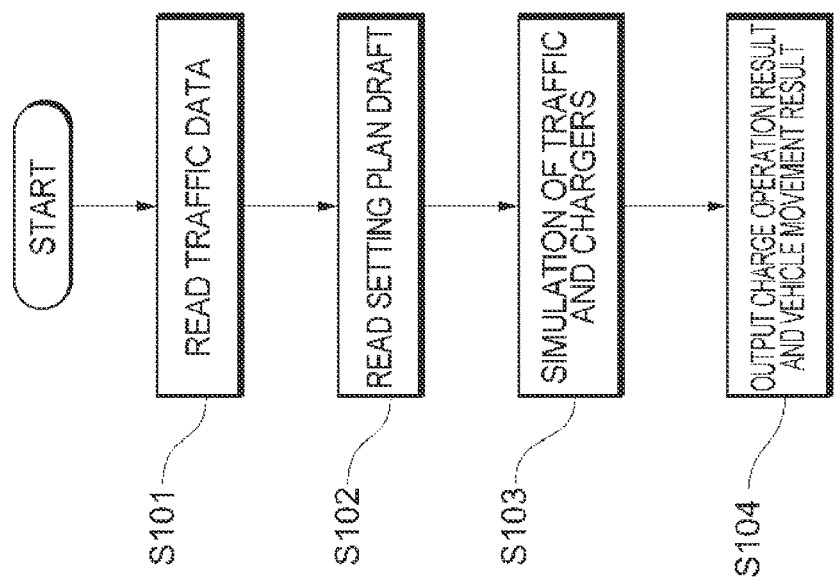
FIG. 4 is a flowchart of an operation example of the charger arrangement planning supporting apparatus according to the first embodiment of the present invention.

FIG. 4 is a flowchart for explaining an operation example of the charger arrangement planning supporting apparatus 10 according to this embodiment. Processing steps explained below can be executed with order arbitrarily changed or in parallel in a range in which contradiction is not caused in processing content. Other steps may be added among the processing steps. A step described as one step for convenience can be executed while being divided into a plurality of steps. A step described while being divided into a plurality of steps for convenience can be grasped as one step.

First, the traffic simulation unit 1031 and the charger determining unit 104 acquire the road network data and the movement model of the vehicles from the traffic model storing unit 102 (S101).

Subsequently, the charger simulation unit 1032 acquires information concerning setting places of chargers and a plan draft of the number of chargers to be set (S102).

Subsequently, the simulation unit 103 executes a simulation of the virtual vehicles and the virtual chargers on the basis of data acquired in steps S101 and S102 (S103). In executing the simulation, for determination of the virtual chargers used by the virtual vehicles, the simulation unit 103 transmits to the charger determining unit 104 the locations of the virtual vehicles, residual charges of the rechargeable batteries, and situations of use of the virtual chargers. The charger determining unit 104 determines, on the basis of the data received from the simulation unit 103, the virtual chargers used by the virtual vehicles.

When the simulation ends, the simulation unit 103 outputs movement histories of the virtual vehicles and operation histories of the virtual chargers during the simulation as simulation results (S104).

Figure 5:
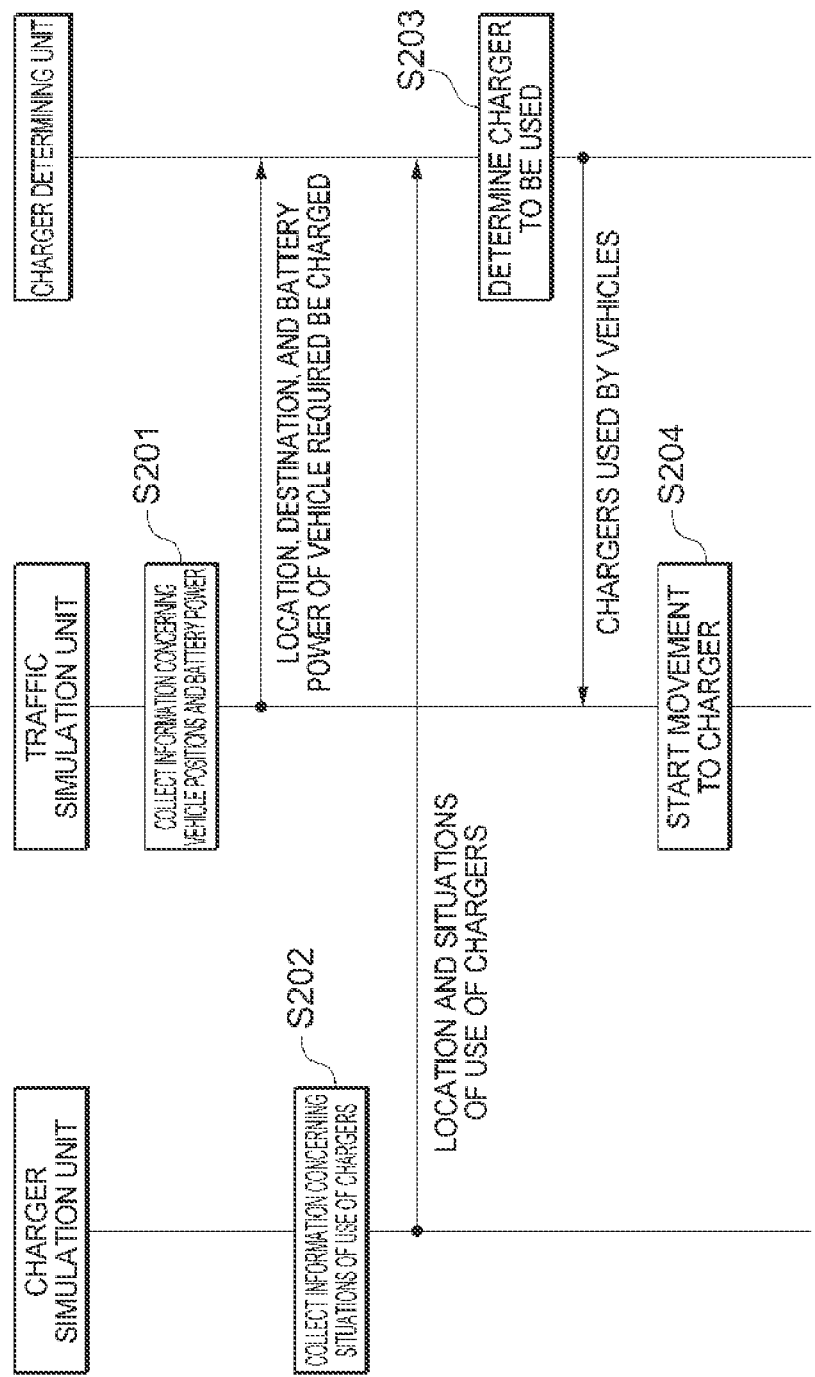
FIG. 5 is a flowchart of an example of simulation processing of the charger arrangement planning supporting apparatus according to the first embodiment of the present invention.

Simulation processing in step S103 is explained in detail using an example shown in FIG. 5.

As shown in the figure, the traffic simulation unit 1031 collects information concerning the locations of the virtual vehicles and residual charges of the rechargeable batteries and transmits the locations, destinations (destination zones), and the residual charges of the virtual vehicles determined as requiring charging to the charger determining unit 104 (S201).

Whether charging of the virtual vehicles is necessary may be determined on the basis of the residual charges of the rechargeable batteries. For example, the virtual vehicles are charged when the residual charges decrease to 30% or less of a full capacity. The traffic simulation unit 1031 may transmit information concerning all the virtual vehicles to the charger determining unit 104 without determining whether charging of the virtual vehicles is necessary. In this case, the charger determining unit 104 determines whether charging of the virtual vehicles is necessary.

The charger simulation unit 1032 collects the information concerning the locations and the situations of use of the virtual chargers and transmits the information to the charger determining unit 104 (S202). Processing in steps S201 and S202 may be performed, for example, at an interval of a fixed time (e.g., every 3 minutes).

The charger determining unit 104 determines, on the basis of the information acquired in steps S201 and S202, by which of the virtual chargers the virtual vehicles are charged and notifies the traffic simulation unit 1031 of the virtual chargers (S203).

A method in which the charger determining unit 104 determines virtual chargers used by the virtual vehicles is explained with reference to an example.

First, the charger determining unit 104 calculates, concerning the virtual vehicles, information concerning virtual chargers that the virtual vehicles can reach with the present residual charges shown in FIG. 6. The charger determining unit 104 calculates excess moving distances required to reach the virtual chargers and estimated times (reachable times) required to reach the virtual chargers. The excess moving distances are distances that the virtual vehicles have to travel more compared with shortest routes in order to move to destinations (destination zones).

Figure 7:
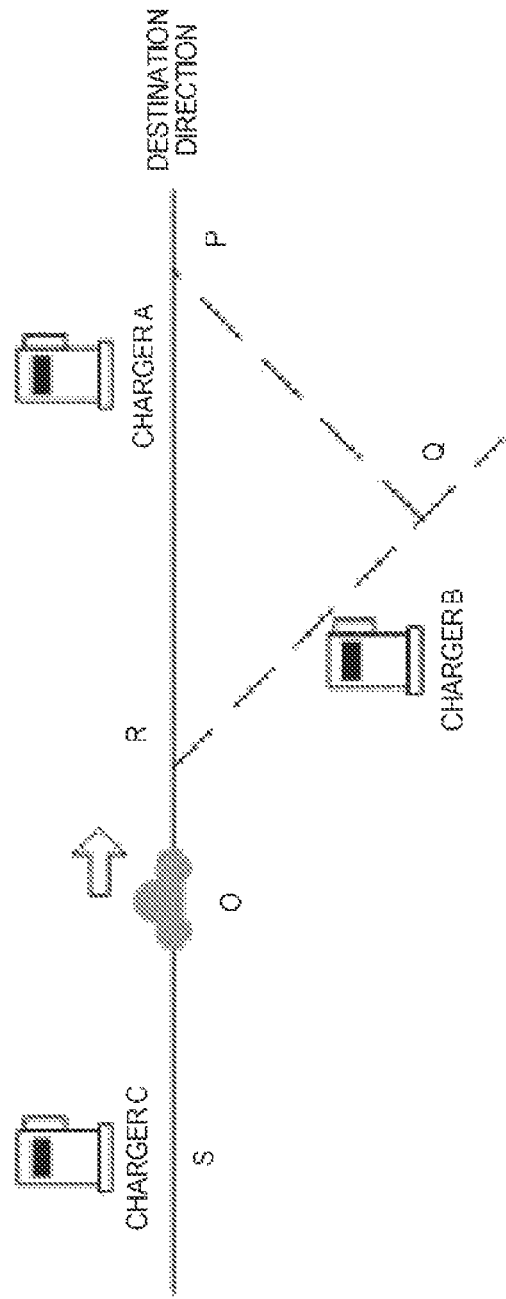
FIG. 7 is a diagram for explaining the method in which the charger determining unit determines the virtual chargers according to the first embodiment of the present invention.

For example, in FIG. 7, it is assumed that a solid line indicates a shortest route to a destination of a virtual vehicle present at a point O. As shown in the figure, as candidates of a virtual charger that the virtual vehicle can reach with the present residual charge, there are a charger A at a point P, a charger B at a point Q, and a charger C at a point S.

Since the charger A is present on the shortest route, the excess moving distance is zero. When using the charger B, since the virtual vehicle has to pass a route of a dotted line, the excess distance for reaching the destination is |RQ|+ |QP|−|RP|(|XY| is a distance between points X and Y). When using the charger C, since the virtual vehicle has already passed the point S and needs to return to the point S, the excess moving distance for reaching the destination is 2|OS|.

The charger determining unit 104 performs the calculation shown in FIG. 6 concerning the virtual vehicles and determines virtual chargers to be used.

For example, the charger determining unit 104 can select virtual chargers, reachable times to which are the shortest. Consequently, it is possible to select virtual chargers closest to the virtual vehicles. In the example shown in FIG. 6, the charger C is selected.

The charger determining unit 104 may select virtual chargers, excess moving distances to which are the shortest. Consequently, since overall moving distances to reach the destinations can be reduced, it is possible to minimize overall energy consumption. In the example shown in FIG. 6, the charger A is selected.

When the virtual chargers are selected by the method explained above, in some case, the same virtual charger is selected for a plurality of virtual vehicles. In this case, it may be determined on the basis of other criteria to which virtual vehicle the virtual charger is allocated. For example, concerning a virtual vehicle E and a virtual vehicle F, when a virtual charger G is selected as a virtual charger, reachable times to which are the shortest, the virtual charger G is allocated to the virtual vehicle with a shorter excess moving distance and a virtual charger, a reachable time to which is the second shortest, is selected for the other virtual vehicle. By repeating the processing, it is possible to cope with the case in which the same virtual charger is selected for a plurality of virtual vehicles.

The traffic simulation unit 1031 moves, on the basis of the information concerning the virtual chargers acquired in step S203, the relevant virtual vehicles to the locations of the virtual chargers to be respectively used by the virtual vehicles (step S204).

A procedure shown in FIG. 5 is one example. Data transmitted and received between the simulation unit 103 and the charger determining unit 104, timing of the transmission and reception, and processing order can be changed in a range in which contradiction is not caused in processing content.

Operation histories of the virtual chargers and movement histories of the virtual vehicles output by the simulation unit 103 as simulation results after the simulation ends are explained with reference to an example.

FIG. 8 is an example of the operation histories of the virtual chargers. As shown in the figure, concerning the virtual chargers, setting positions, rates of operation during a simulation, accumulated waiting times required by the virtual vehicles for charting, and the numbers of times the virtual chargers are used by the virtual vehicles during the simulation are displayed. The rates of operation of the virtual chargers can be, for example, rates of times in which the virtual chargers are "in use" in time from the start to the end of the simulation. Note that the operation histories may be output concerning all the virtual chargers or data of several virtual chargers may be sampled and output.

FIG. 9 is an example of the movement histories of the virtual vehicles. As shown in the figure, concerning the virtual vehicles, origin zones, destination zones, moving distances during a simulation, and the numbers of times of use of the virtual chargers during the simulation are displayed. When electricity shortage is caused during the simulation, locations at that point and the number of times of the electricity shortage are displayed. Note that the movement histories may be output concerning all the virtual vehicles or data of several virtual vehicles may be sampled and output.

Note that information included in the operation histories of the virtual chargers and the movement histories of the virtual vehicles is not limited to the information explained above. A part of the items explained above may be output.

As explained above, according to this embodiment, situations of movement of electric vehicles and situations of use of rechargeable batteries are simulated on the basis of the traffic model and the setting plan draft of the chargers on the roads in the real world. In the simulation, chargers with which the vehicles are charged are determined on the basis of the locations of the vehicles, the residual charges of the rechargeable batteries, and the locations and the situations of use of the chargers around the vehicles. Therefore, waiting times until the vehicles are charged are short compared with waiting times required when the vehicles are simply charged by chargers on a route. Since the vehicles actively select unoccupied chargers, a rate of operation of each of the chargers increases. Therefore, it is possible to satisfy demands of all the vehicles with a smaller number of chargers. If results of the simulation according to this embodiment are referred to in this way, it is possible to efficiently plan setting of the chargers.

In the simulation, reservations of the virtual chargers by the virtual vehicles may be taken into account. For example, when a certain virtual vehicle reserves a virtual charger on a route in advance, the other virtual vehicles are disabled to use the virtual charger during time of the reservation. Therefore, the charger determining unit 104 selects the next candidate even if the virtual charger is a virtual charger closest to the other virtual vehicles.

By taking into account the reservations of the virtual chargers by the virtual vehicles in the simulation by the simulation unit 103 in this way, it is possible to provide information useful for planning setting of the chargers taking into account an act of reservation of the chargers in the real world.

Second Embodiment.

Figure 10:
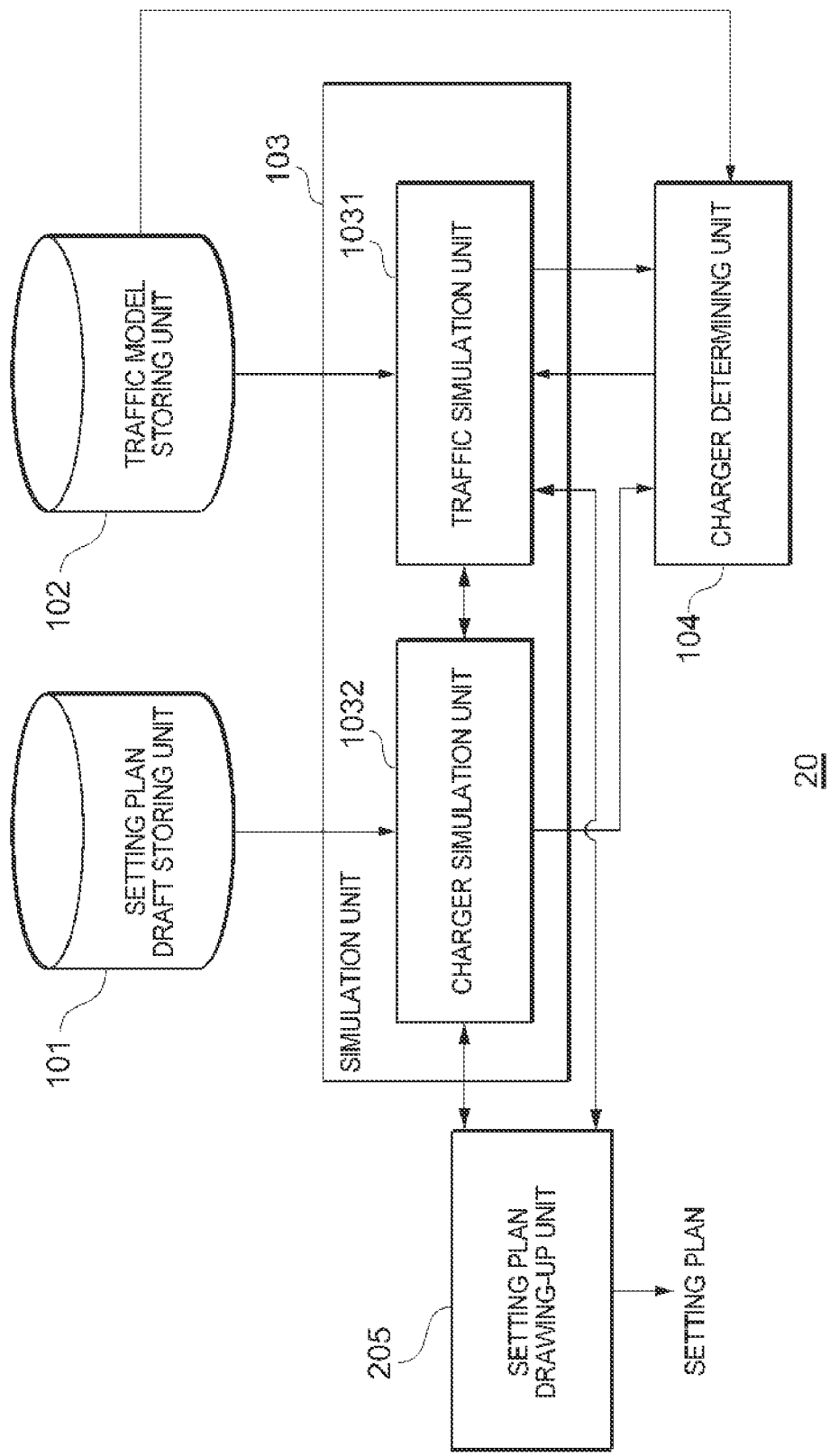
FIG. 10 is a block diagram showing the configuration of a charger arrangement planning supporting apparatus according to a second embodiment of the present invention.

FIG. 10 is a block diagram showing the configuration of a charger arrangement planning supporting apparatus 20 according to a second embodiment of the present invention. As shown in FIG. 10, the charger arrangement planning supporting apparatus 20 according to the second embodiment includes a setting plan drawing-up unit 205 in addition to the components of the charger arrangement planning supporting apparatus 10 according to the first embodiment. The other components are the same as those in the first embodiment. The components same as those in the first embodiment are denoted by reference numerals and signs same as those shown in FIG. 1.

The setting plan drawing-up unit 205 outputs a setting plan of chargers using simulation results output by the simulation unit 103.

First, the simulation unit 103 performs a simulation in a state in which virtual chargers are set by a settable number in all setting candidate places stored in the setting plan draft storing unit 101. The setting plan drawing-up unit 205 compares the simulation results and criteria determined in advance and determines whether the number of chargers is reduced from the present situation. Examples of the criteria include criteria for reducing the virtual chargers until an average rate of operation of all the virtual chargers exceeds a fixed value and for reducing the chargers until an average waiting time of all the virtual vehicles exceeds a fixed value.

When determining that the number of virtual chargers has been sufficiently reduced as a result of the comparison with the reference values, the setting plan drawing-up unit 205 outputs an arrangement at that point as a setting plan. When reducing the virtual chargers, the setting plan drawing-up unit 205 gives priority to the virtual chargers using the simulation results. Examples of a method of giving priority include a method of giving high priority to the virtual chargers with high rates of operation. The setting plan drawing-up unit 205 excludes the virtual charger with the lowest priority from simulation targets and carries out the simulation again. By repeating the processing until simulation results satisfy the criteria in this way, it is possible to narrow down setting places of the virtual chargers.

Figure 11:
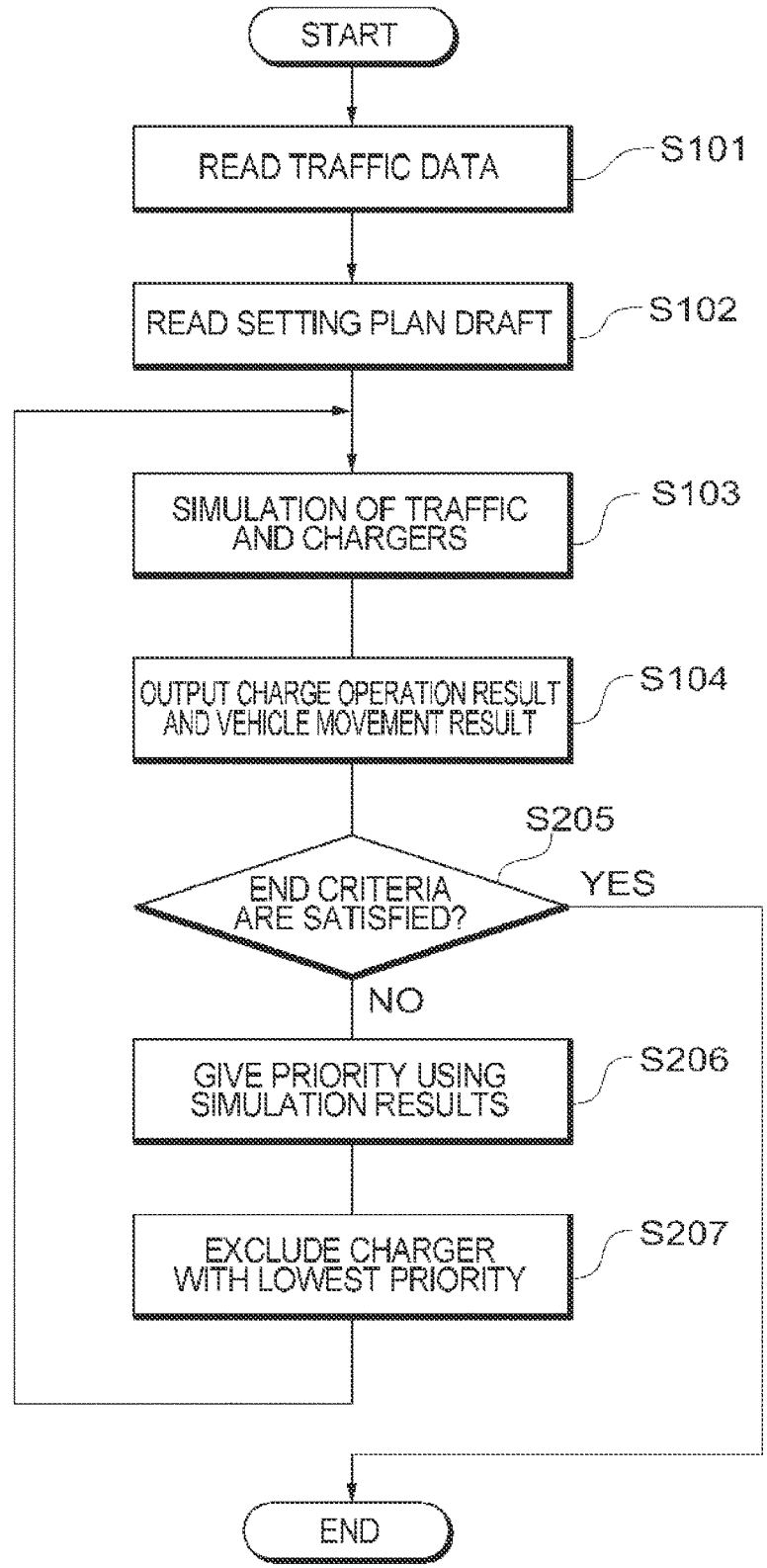
FIG. 11 is a flowchart of the operation of the charger arrangement planning supporting apparatus according to the second embodiment of the present invention.

FIG. 11 is a flowchart of the operation of the charger arrangement planning supporting apparatus 20 according to the second embodiment. Reference signs same as those of the flowchart in FIG. 4 represent operations same as those of the steps shown in FIG. 4. Therefore, explanation of the steps is omitted.

In the second embodiment, the setting plan drawing-up unit 205 determines whether the simulation results output in step S104 satisfy predetermined criteria (S205). When the simulation results do not satisfy the criteria (NO), the setting plan drawing-up unit 205 gives priority to the virtual chargers using the simulation results (S206).

Subsequently, in accordance with priorities given to the virtual chargers the setting plan drawing-up unit 205 excludes the virtual charger with the lowest priority from simulation targets (S207), returns to step S103, and carries out the simulation again.

As explained above, according to this embodiment, it is possible to provide a setting plan for the chargers using the simulation results. According to this embodiment, since the setting plan is output simply by setting criteria for setting of the chargers, it is possible to quickly draw up the setting plan compared with a setting plan drawn up by a human looking at the simulation results. Further, it is possible to each perform a plan change when the setting criteria for the chargers are changed.

This application claims priority based on Japanese Patent Application No. 2011-21887 filed on Feb. 3, 2011, the entire disclosure of which is incorporated herein.

The present invention as thus explained with reference to the embodiments are not limited to thereto. Various modifications understandable by those skilled in the art can be made to the configuration and the details of the present invention within the scope of the present invention.

A part or all of the embodiments can be described as indicated by notes below but are not limited to the notes described below.

(Note 1) A charger arrangement planning supporting apparatus comprising:

a simulation unit configured to simulate, on a virtual road network, movement of a plurality of virtual electric vehicles and consumption of rechargeable batteries and simulate situations of use of the plurality of virtual chargers arranged on the virtual road network; and a charger determining unit configured to select which of the virtual chargers is used to charge the virtual electric vehicle when the virtual electric vehicle needs to be charged on the basis of residual charge of the rechargeable battery and a present location of the virtual electric vehicle and a situation of use and a location of each of the virtual chargers, wherein the simulation unit outputs, after finishing the simulation, a movement history of the virtual electric vehicle and an operation history of the virtual charger.

(Note 2) The charger arrangement planning supporting apparatus according to note 1, wherein the charger determining unit selects a virtual charger present in a location closest to a present location of the virtual electric vehicle.

(Note 3) The charger arrangement planning supporting apparatus according to note 1, wherein the charger determining unit selects a virtual charger, an extra distance to which is shortest for the virtual electric vehicle to move, compared with a distance of a shortest route for the virtual electric vehicle to reach a destination.

(Note 4) The charger arrangement planning supporting apparatus according to any one of notes 1 to 3, wherein the simulation processing unit outputs, as an operation history, a rate of operation of each of the virtual chargers from a start to an end of the simulation.

(Note 5) The charger arrangement planning supporting apparatus according to any one of notes 1 to 3, wherein the simulation processing unit outputs, as the operation history, an accumulated waiting time required by the virtual electric vehicle to be charged with respect to each of the virtual chargers.

(Note 6) The charger arrangement planning supporting apparatus according to any one of notes 1 to 3, wherein with respect to each of the virtual electric vehicles, when a virtual electric vehicle runs out of power from a start to an end of the simulation, the simulation processing unit outputs, as the movement history, a location where the virtual electric vehicle runs out of power.

(Note 7) The charger arrangement planning supporting apparatus according to any one of notes 1 to 6, further comprising a setting plan drawing-up unit configured to create a plan of setting chargers on the basis of the movement history or the operation history.

(Note 8) The charger arrangement planning supporting apparatus according to note 7, wherein the setting plan drawing-up unit determines, on the basis of the movement history or the operation history, whether the number of the virtual chargers is reduced and, when the number of the virtual chargers is reduced, performs the simulation again to thereby narrow down positions of setting the virtual chargers.

(Note 9) A charging control method comprising:

simulating, on a virtual road network, movement of a plurality of virtual electric vehicles and consumption of rechargeable batteries and simulating situations of use of the plurality of virtual chargers arranged on the virtual road network;

selecting which of the virtual chargers is used to charge the virtual electric vehicle when the virtual electric vehicle needs to be charged on the basis of residual charge of the rechargeable battery and a present location of the virtual electric vehicle and a situation of use and a location of each of the virtual chargers; and outputting, after finishing the simulation, a movement history of the virtual electric vehicle and an operation history of the virtual charger.

(Note 10) A program for causing a computer to function as:

a simulation unit configured to simulate, on a virtual road network, movement of a plurality of virtual electric vehicles and consumption of rechargeable batteries and simulate situations of use of the plurality of virtual chargers arranged on the virtual road network; and a charger determining unit configured to select which of the virtual chargers is used to charge the virtual electric vehicle when the virtual electric vehicle needs to be charged on the basis of residual charge of the rechargeable battery and a present location of the virtual electric vehicle and a situation of use and a location of each of the virtual chargers, wherein the simulation unit outputs, after finishing the simulation, a movement history of the virtual electric vehicle and an operation history of the virtual charger.

The present invention is suitable for supporting setting planning for charging facilities on the assumption that users efficiently use the charging facilities on the basis of states of road traffic and states of use of the charging facilities.

10 charger arrangement planning supporting apparatus
101 setting plan draft storing unit
103 simulation unit
104 charger determining unit
1031 traffic simulation unit
1032 charger simulation unit
205 setting plan drawing-up unit

I claim:

1. A charger arrangement planning supporting apparatus comprising:
   at least one memory operable to store program instructions for creating a plan of setting chargers;
   at least one processor operable to read the stored program instructions; and
   according to the stored program instructions, the at least one processor is configured to be operated as:
   a simulation unit simulating, on a virtual road network, movement of a virtual electric vehicle and consumption of rechargeable batteries and simulating situations of use of a plurality of virtual chargers arranged on the virtual road network;
   a charger determining unit selecting a virtual charger, of the plurality of virtual chargers, to charge the virtual electric vehicle on the basis of:
   residual charge of the rechargeable battery,
   a present location of the virtual electric vehicle,
   a location of each of the plurality of virtual chargers, and
   an excess moving distance of the virtual electric vehicle generated by using the virtual charger to reach a destination; and
   a setting plan drawing-up unit configured to create the plan of setting chargers based on a movement history or an operation history,
   wherein the charger determining unit selects a virtual charger on the basis of a situation of use comprising a fact as to whether each of the plurality of virtual chargers is in use or not,
   in response to the selected virtual charger being in use, the charger determining unit selects an alternative virtual charger, and
   when the charger determining unit selects the virtual charger on the basis of the excess moving distance of the virtual electric vehicle to reach a destination and a period of time to reach the virtual charger, such that if a same one virtual charger is selected for a plurality of virtual electric vehicles, the one virtual charger is allocated to a virtual electric vehicle with a shorter excess moving distance and a different virtual charger, a reachable time to which is a second shortest, is selected for another virtual electric vehicle, and
   wherein charging facilities are set based on the plan.

2. The charger arrangement planning supporting apparatus according to claim 1, wherein the charger determining unit selects a virtual charger present in a location closest to a present location of the virtual electric vehicle.

3. The charger arrangement planning supporting apparatus according to claim 1, wherein the charger determining unit selects a virtual charger, an extra distance to which is shortest for the virtual electric vehicle to move, compared with a distance of a shortest route for the virtual electric vehicle to reach the destination.

4. The charger arrangement planning supporting apparatus according to claim 1, wherein the simulation unit outputs, as an operation history, a rate of operation of each of the virtual chargers from a start to an end of the simulation.

5. The charger arrangement planning supporting apparatus according to claim 1, wherein the simulation unit outputs, as an operation history, an accumulated waiting time required by the virtual electric vehicle to be charged with respect to each of the virtual chargers.

6. The charger arrangement planning supporting apparatus according to claim 1, wherein with respect to each of the virtual electric vehicles, when a virtual electric vehicle runs out of power from a start to an end of the simulation, the simulation unit outputs, as a movement history, a location where the virtual electric vehicle runs out of power.

7. The charger arrangement planning supporting apparatus according to claim 1, further comprising a setting plan drawing-up unit configured to create a plan of setting chargers on the basis of a movement history or an operation history.

8. The charger arrangement planning supporting apparatus according to claim 7, wherein the setting plan drawing-up unit determines, on the basis of a movement history or an operation history, whether the number of the virtual chargers is reduced and, when the number of the virtual chargers is reduced, performs the simulation again to thereby narrow down positions of setting the virtual chargers.

9. The charger arrangement planning supporting apparatus according to claim 8, wherein
   the setting plan drawing-up unit reduces the virtual chargers until an average rate of operation of all the virtual chargers exceeds a fixed value.

10. The charger arrangement planning supporting apparatus according to claim 8, wherein
    the setting plan drawing-up unit excludes a virtual charger with a lowest rate of operation from simulation targets.

11. The charger arrangement planning supporting apparatus according to claim 1, wherein
    the charger determining unit selects a virtual charger on the basis of the time to reach the virtual charger.

12. The charger arrangement planning supporting apparatus according to claim 1, wherein
    when the charger determining unit selects the virtual charger on the basis of the excess moving distance of the virtual electric vehicle to reach a destination and a period of time to reach the virtual charger, such that if a same one virtual charger is selected for a plurality of virtual electric vehicles, the one virtual charger is allocated to a virtual electric vehicle with a shorter excess moving distance and a different virtual charger, a reachable time to which is a second shortest, is selected for another virtual electric vehicle.

13. A charging control method to be executed by a charger arrangement planning supporting apparatus which comprises a central processing unit (CPU) and a memory connected with the CPU and storing a program for creating a plan of setting chargers, wherein the CPU reads the program from the memory and thereby executes the method comprising:

simulating, on a virtual road network, movement of a virtual electric vehicle and consumption of rechargeable batteries and simulating situations of use of a plurality of virtual chargers arranged on the virtual road network;

selecting a virtual charger, of the plurality of virtual chargers, to charge the virtual electric vehicle on the basis of:

residual charge of the rechargeable battery, a present location of the virtual electric vehicle, a location of each of the virtual chargers, and an excess moving distance of the virtual electric vehicle generated by using the virtual charger to reach a destination; and creating the plan of setting chargers based on a movement history or an operation history, wherein the selecting the virtual charger on the basis of a situation of use comprises a fact as to whether each of the plurality of virtual chargers is in use or not, in response to the selected virtual charger being in use, selecting an alternative virtual charger, and when the virtual charger is selected on the basis of the excess moving distance of the virtual electric vehicle to reach a destination and a period of time to reach the virtual charger, such that if a same one virtual charger is selected for a plurality of virtual electric vehicles, allocating the one virtual charger to a virtual electric vehicle with a shorter excess moving distance and selecting a different virtual charger, a reachable time to which is a second shortest, for another virtual electric vehicle, and wherein charging facilities are set based on the plan.

14. A non-transitory computer readable storage medium recording thereon a charger arrangement planning supporting program for creating a plan of setting chargers, the program causing a computer to implement a method, the method comprising:

simulating, on a virtual road network, movement of a virtual electric vehicle and consumption of rechargeable batteries and simulating situations of use of a plurality of virtual chargers arranged on the virtual road network;

selecting a virtual charger, of the plurality of virtual chargers, to charge the virtual electric vehicle on the basis of:

residual charge of the rechargeable battery, a present location of the virtual electric vehicle, a location of each of the virtual chargers, and an excess moving distance of the virtual electric vehicle generated by using the virtual charger to reach a destination; and creating the plan of setting chargers based on a movement history or an operation history, wherein the selecting the virtual charger on the basis of a situation of use comprises a fact as to whether each of the plurality of virtual chargers is in use or not, in response to the selected virtual charger being in use, selecting an alternative virtual charger, and when the virtual charger is selected on the basis of the excess moving distance of the virtual electric vehicle to reach a destination and a period of time to reach the virtual charger, such that if a same one virtual charger is selected for a plurality of virtual electric vehicles, allocating the one virtual charger to a virtual electric vehicle with a shorter excess moving distance and selecting a different virtual charger, a reachable time to which is a second shortest, for another virtual electric vehicle, and wherein charging facilities are set based on the plan.

\* \* \* \* \*